(12) United States Patent
Aoki (10) Patent No.: US 10,861,812 B2
(45) Date of Patent: Dec. 8, 2020

(54) ELECTRONIC APPARATUS

(71) Applicant: Toshiba Memory Corporation, Tokyo (JP)

(72) Inventor: Hideo Aoki, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/281,004

(22) Filed: Feb. 20, 2019

(65) Prior Publication Data

US 2020/0091102 A1 Mar. 19, 2020

(30) Foreign Application Priority Data

Sep. 14, 2018 (JP) .................. 2018-173030

(51) Int. Cl.
*H01L 25/18* (2006.01)
*H01L 23/538* (2006.01)
*H01L 23/00* (2006.01)

(52) U.S. Cl.
CPC .......... *H01L 24/13* (2013.01); *H01L 23/5384* (2013.01); *H01L 23/5386* (2013.01); *H01L 24/04* (2013.01); *H01L 24/16* (2013.01); *H01L 25/18* (2013.01); *H01L 2224/0401* (2013.01); *H01L 2224/13007* (2013.01); *H01L 2224/16225* (2013.01)

(58) Field of Classification Search
CPC . H01L 23/3114; H01L 24/94; H01L 25/0657; H01L 2224/94; H01L 2225/06548; H01L 2225/1041
See application file for complete search history.

(56) References Cited

U.S. PATENT DOCUMENTS

| | | | |
|---|---|---|---|
| 8,896,111 | B2 | 11/2014 | Tanimoto et al. |
| 9,922,965 | B2 | 3/2018 | Kim et al. |
| 2015/0069632 | A1 | 3/2015 | Ozawa |
| 2015/0091149 | A1* | 4/2015 | Jang .................. H01L 23/49811 257/686 |

(Continued)

FOREIGN PATENT DOCUMENTS

| | | |
|---|---|---|
| CN | 108242437 A | 7/2018 |
| TW | 200611345 A | 4/2006 |

(Continued)

*Primary Examiner* — Daniel P Shook
(74) *Attorney, Agent, or Firm* — Kim & Stewart LLP (57) ABSTRACT

An electronic apparatus includes first and second packages. The first package includes a first semiconductor chip between opposing first and second surfaces of the first package, a plurality of terminals on the first semiconductor chip facing a first direction that is perpendicular to the first and second surface, the terminals including first input/output terminals and a second input/output terminal, and a plurality of bumps that are electrically connected to the plurality of first input/output terminals at positions that are directly below the first semiconductor chip in the first direction. The second package includes a second semiconductor chip provided on the second surface of the first package, a wire that electrically connects the second semiconductor chip to a conductor that is electrically connected to the second input/output terminal, and coating resin that covers the second surface of the first package, the second semiconductor chip and the wire.

18 Claims, 7 Drawing Sheets

(56) References Cited

U.S. PATENT DOCUMENTS

| | | | |
|---|---|---|---|
| 2015/0357269 A1* | 12/2015 | Im | H01L 25/105 |
| | | | 257/675 |
| 2017/0069564 A1 | 3/2017 | Kwon et al. | |
| 2017/0358559 A1 | 12/2017 | Ye et al. | |
| 2018/0026022 A1 | 1/2018 | Lee et al. | |
| 2018/0182725 A1 | 6/2018 | Shindo | |
| 2018/0190635 A1 | 7/2018 | Choi et al. | |

FOREIGN PATENT DOCUMENTS

| | | |
|---|---|---|
| TW | 201528446 A | 7/2015 |
| TW | 201824473 A | 7/2018 |

\* cited by examiner

ELECTRONIC APPARATUS

CROSS-REFERENCE TO RELATED APPLICATIONS

This application is based upon and claims the benefit of priority from Japanese Patent Application No. 2018-173030, filed Sep. 14, 2018, the entire contents of which are incorporated herein by reference.

FIELD

Embodiments described herein relate generally to an electronic apparatus.

BACKGROUND

A semiconductor storage device in which a controller chip and a plurality of memory chips are stacked on a substrate is known. The semiconductor storage device is packaged as, for example, a ball grid array (BGA), in which a plurality of solder balls are provided on a bottom surface of the substrate.

The controller chip transmits and receives a signal to and from a processor through the solder balls. When an impedance mismatch is present in an electrical path between the processor and the controller chip, signal quality may deteriorate.

DETAILED DESCRIPTION

In general, according to one embodiment, an electronic apparatus, especially, a semiconductor storage device includes a first package including a first semiconductor chip and a second package including a second semiconductor chip. The first package includes opposing first and second surfaces, a plurality of first terminals provided on the first semiconductor chip and facing the first direction, a second terminal that is provided on the first semiconductor chip and faces the first direction, a power supply terminal, a first interlayer connection conductor that is spaced from the first semiconductor chip in a second direction intersecting the first direction, a first connection conductor that connects the second terminal and the first interlayer connection conductor to each other, a second connection conductor at least a part of which is provided on the second surface and that is connected to the first interlayer connection conductor, a plurality of first bumps that are electrically connected to the plurality of first terminals and protrude from the first surface at positions that are directly below the first semiconductor chip in the first direction, and a power supply bump that is electrically connected to the power supply terminal, wherein there is no bump between the first bumps and the power supply bump that is not directly below the first semiconductor chip in the first direction. The second package includes a coating resin that covers the second surface, the second semiconductor chip, which is provided on the second surface, and a wire that electrically connects the second semiconductor chip and the second connection conductor to each other.

First Embodiment

Hereinafter, a first embodiment will be described with reference to FIGS. 1 to 4. In the present disclosure, the same components according to embodiments and the description thereof may be described using two or more different expressions. The components and the description thereof are not limited to the expressions of the present disclosure. The components may be specified using names different from those used in the present disclosure. In addition, the components may be described using expressions different from those used in the present disclosure.

Figure 1:
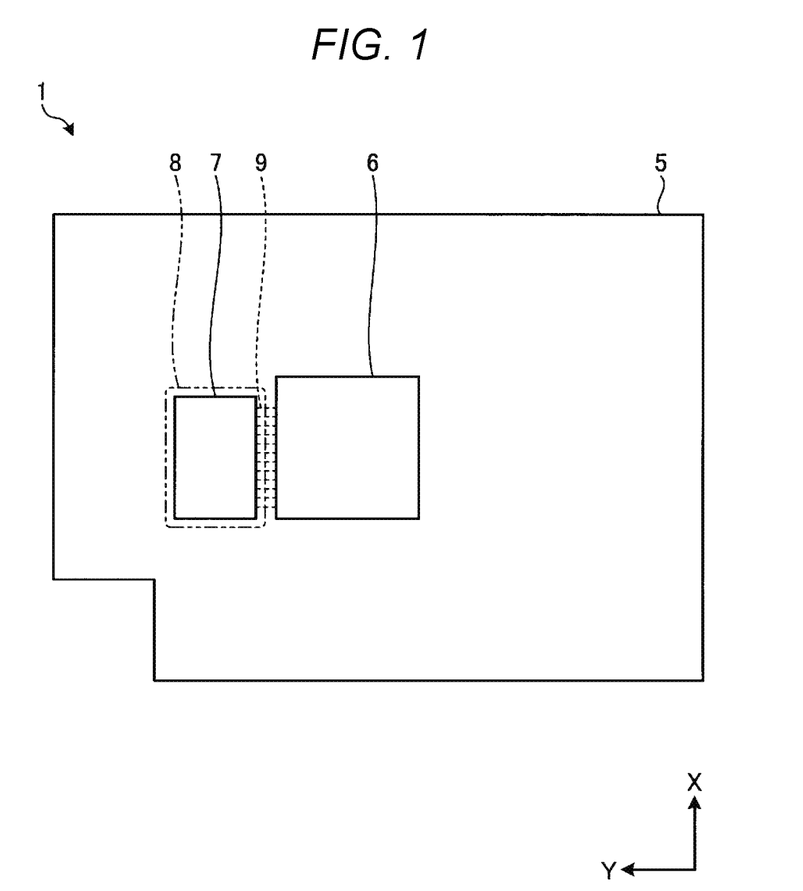
FIG. 1 is a plan view schematically illustrating an electronic apparatus according to a first embodiment.

FIG. 1 is a plan view schematically illustrating an electronic apparatus 1 according to the first embodiment. One example of the electronic apparatus 1 of the embodiment is a smartphone. The electronic apparatus 1 may also be, for example, a personal computer, a portable computer, a tablet, other types of mobile phone, a television receiver, an USB flash drive, an SD card, an eMMC® (embedded Multi Media Card), a memory card, other storage devices, a wearable device, a smart speaker, home electric appliances, or other devices.

As illustrated in FIG. 1, the electronic apparatus 1 includes a motherboard 5, a processor 6, a semiconductor storage device 7, and an underfill 8. The motherboard 5 is an example of a substrate. A daughter board is another example of a substrate. The processor 6 is an example of a controller. The electronic apparatus 1 may further include other components such as a housing or a display device.

The motherboard 5 is, for example, printed circuit board (PCB). The motherboard 5 includes a plurality of wirings 9. The wirings 9 electrically connect the processor 6 and the semiconductor storage device 7 to each other.

The processor 6 and the semiconductor storage device 7 are mounted on the motherboard 5. The processor 6 is, for example, a system-on-a-chip (SoC). The processor 6 may also be an integrated circuit (IC) or a circuit. The processor 6 controls the electronic apparatus 1 including the semiconductor storage device 7.

Figure 2:
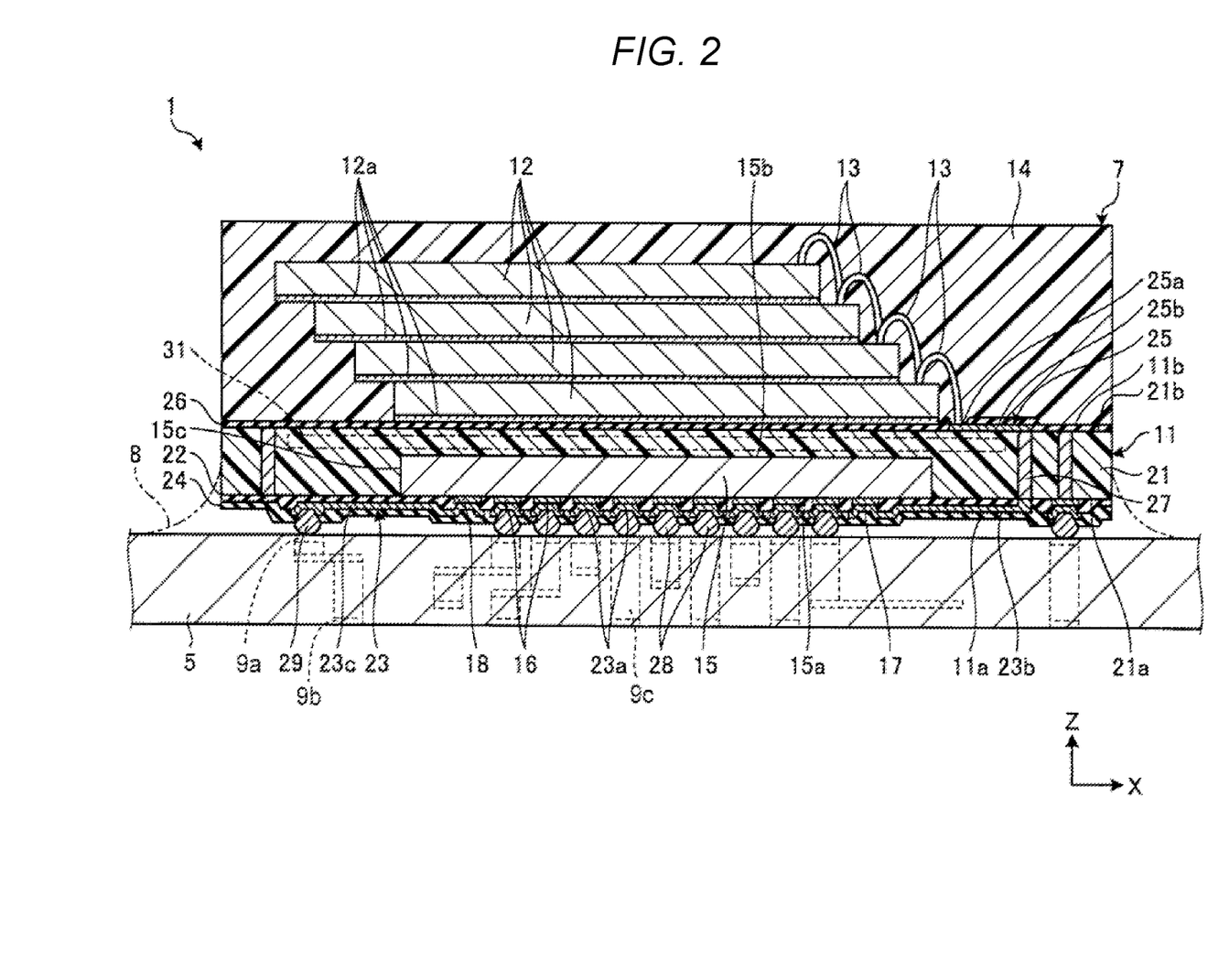
FIG. 2 is a cross-sectional view schematically illustrating a semiconductor storage device according to the first embodiment.

FIG. 2 is a cross-sectional view schematically illustrating a semiconductor storage device 7 according to the first embodiment. One example of the semiconductor storage device 7 of the embodiment is a solid state drive (SSD), more generally a semiconductor package. The semiconductor storage device 7 may be another device such as an eMMC or an UFS (Universal Flash Storage).

In the present disclosure, X-axis, Y-axis, and Z-axis are defined as illustrated in each of the drawings. The X-axis, the Y-axis, and the Z-axis are perpendicular to each other. The X-axis is defined to be along a width direction of the semiconductor storage device 7. The Y-axis is defined to be along a length (or depth) direction of the semiconductor storage device 7. The Z-axis is defined to be along a height (or thickness) direction of the semiconductor storage device 7.

The semiconductor storage device 7 includes a first package 11, and a second package including a plurality of memory chips 12, a plurality of wires 13 and a sealing resin 14. The sealing resin 14 is an example of a coating resin. In the first embodiment, a memory controller 15 is provided in the first package 11.

In addition, the semiconductor storage device 7 may further include other components such as a power supply circuit. The power supply circuit of the semiconductor storage device 7 generates a plurality of different internal direct current power supply voltages from an external direct current power supplied from the power supply circuit of the electronic apparatus 1. The power supply circuit supplies the internal direct current power supply voltages to the respective circuits in the semiconductor storage device 7. The power supply circuit detects the rising of the external power, generates a power-on reset signal, and supplies the power-on reset signal to the memory controller 15.

The first package 11 is a semiconductor package having a structure of a fan out package (FOP) or a fan out wafer level package (FOWLP). The first package 11 is not limited to this example.

The first package 11 includes a lower surface 11a and an upper surface 11b. For easy understanding, the expressions "upper" and "lower" in the present disclosure will be used based on an up-down direction in each of the drawings and do not limit a position and a direction of each of the components.

The lower surface 11a is a substantially flat surface that faces a negative direction of the Z-axis (direction opposite to an arrow of the Z-axis). The upper surface 11b is a substantially flat surface that is opposite to the lower surface 11a and faces a positive direction of the Z-axis (direction indicated by the arrow of the Z-axis).

The first package 11 includes the memory controller 15 and covers the memory controller 15. Therefore, the memory controller 15 is positioned between the lower surface 11a and the upper surface 11b of the first package 11. The memory controller 15 may form at least a part of the lower surface 11a and the upper surface 11b of the first package 11. In other words, the memory controller 15 may be exposed from at least a part of the lower surface 11a and the upper surface 11b.

The memory controller 15 controls, for example, the storing and reading of data in and from the memory chips 12. The memory controller 15 may control not only the memory 12 but also other electronic components in the semiconductor storage device 7.

The memory controller 15 is electrically connected to the processor 6 through a connection interface (I/F). The connection interface complies with a standard such as UFS or PCI Express (Peripheral Component Interconnect Express, PCIe).

The memory controller 15 includes the lower surface 15a, the upper surface 15b, and a side surface 15c. The lower surface 15a is a substantially flat surface that faces the negative direction of the Z-axis. The upper surface 15b is a substantially flat surface that is positioned opposite to the lower surface 15a and faces the positive direction of the Z-axis. The side surface 15c is positioned between an edge of the lower surface 15a and an edge of the upper surface 15b and faces the X-axis direction and the Y-axis direction.

The memory controller 15 further includes a plurality of first input/output terminals 16, a second input/output terminal 17, and a power supply terminal 18. Each of the first input/output terminals 16, the second input/output terminal 17, and the power supply terminal 18 is formed in a circular shape but may be formed in another shape such as a quadrangular shape.

The first input/output terminals 16, the second input/output terminal 17, and the power supply terminal 18 are provided on the lower surface 15a and face the negative direction of the Z-axis. The first input/output terminals 16, the second input/output terminal 17, and the power supply terminal 18 are arranged in, for example, a lattice (matrix) shape.

The first input/output terminals 16 are provided in the connection interface and are, for example, terminals of the memory controller 15 for transmitting and receiving a differential signal. Alternatively, the first input/output terminals 16 may be a terminal for transmitting and receiving another signal. The first input/output terminals 16 are used when the memory controller 15 transmits and receives data to and from the processor 6.

The second input/output terminal 17 is used when the memory controller 15 transmits and receives data to and from the memory 12. The power supply terminal 18 is electrically connected to the power supply circuit of the electronic apparatus 1. The memory controller 15 supplies the external direct current power from the power supply circuit of the electronic apparatus 1 through the power supply terminal 18.

The memory controller 15 may include a plurality of other terminals including, for example, a terminal that is connected to the ground or a pad that is separated from an electric circuit for fixing the memory controller 15.

The first package 11 further includes a package layer 21, a first insulating layer 22, a first wiring layer 23, a second insulating layer 24, a second wiring layer 25, a third insulating layer 26, a via 27, a plurality of bumps 28, and a power supply bump 29. The via 27 is an example of an interlayer connection conductor.

The package layer 21 is formed of, for example, a material including a synthetic resin such as an epoxy resin as a mold resin or the like and a filler formed of an inorganic material, and has insulating properties. The package layer 21 covers the upper surface 15b and the side surface 15c of the memory controller 15. Therefore, a part of the package layer 21 is positioned in a direction intersecting the negative direction of the Z-axis with respect to the memory controller 15.

The package layer 21 includes a lower surface 21a and an upper surface 21b. The lower surface 21a is a substantially flat surface that faces the negative direction of the Z-axis. The lower surface 21a is substantially continuous with the lower surface 15a of the memory controller 15. The upper surface 21b is a substantially flat surface that faces the positive direction of the Z-axis. The upper surface 21b is spaced from the upper surface 15b of the memory controller 15 in the positive direction of the Z-axis.

The first insulating layer 22 is formed of, for example, a synthetic resin and has insulating properties. The first insulating layer 22 may include an inorganic filler in order to adjust an elastic modulus and a thermal expansion coefficient thereof. The first insulating layer 22 covers the lower surface 15a of the memory controller 15 and the lower surface 21a of the package layer 21. In the first insulating layer 22, a plurality of openings from which the first input/output terminal 16, the second input/output terminal 17, and the power supply terminal 18 are exposed are provided.

The first wiring layer 23 is formed of a conductor such as copper and is provided on the first insulating layer 22. The first wiring layer 23 includes a plurality of pads 23a, a connection wiring 23b, and a power supply wiring 23c. The connection wiring 23b is an example of a connection conductor.

Figure 3:
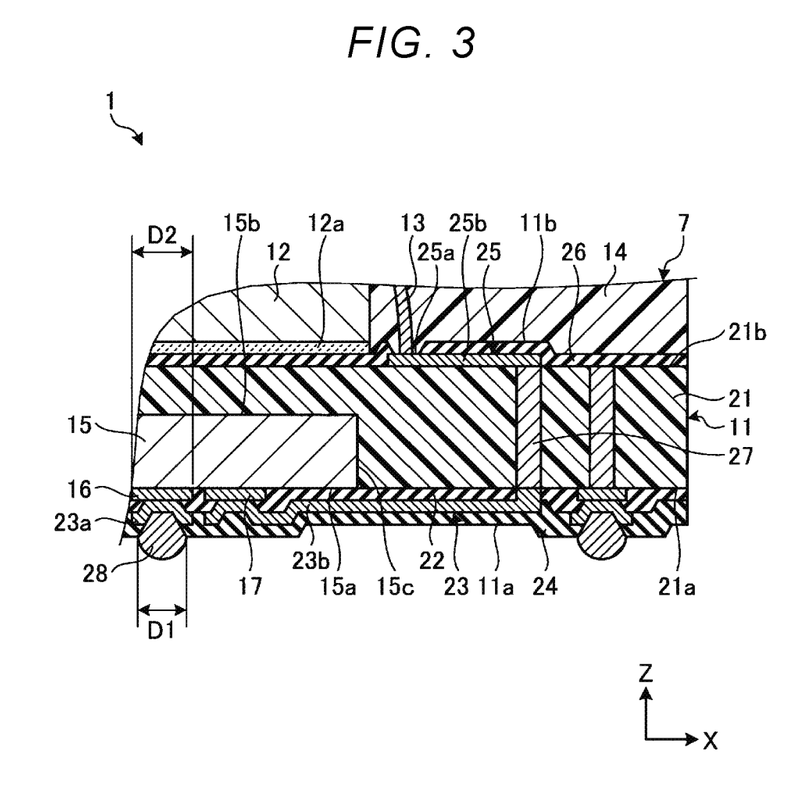
FIG. 3 is a cross-sectional view schematically illustrating a part of the semiconductor storage device according to the first embodiment.

FIG. 3 is a cross-sectional view schematically illustrating a part of the semiconductor storage device 7 according to the first embodiment. As illustrated in FIG. 3, each of the pads 23a is directly below the corresponding first input/output terminal 16 and is connected to the first input/output terminal 16.

A cross-sectional area of the pad 23a is substantially equal to a cross-sectional area of the first input/output terminal 16. In the present disclosure, the cross-sectional area refers to a cross-sectional area perpendicular to the negative direction of the Z-axis unless specified otherwise.

One end portion of the connection wiring 23b is connected to the second input/output terminal 17. The connection wiring 23b extends along the lower surface 11a of the first package 11 between the second input/output terminal 17 and a position that is spaced from the memory controller 15 in the direction intersecting the negative direction of the Z-axis.

As illustrated in FIG. 2, one end portion of the power supply wiring 23c is connected to the power supply terminal 18. The power supply wiring 23c extends along the lower surface 11a of the first package 11 between the power supply terminal 18 and a position that is spaced from the memory controller 15 in the direction intersecting the negative direction of the Z-axis.

The second insulating layer 24 is, for example, a solder resist and is provided on the first insulating layer 22 and the first wiring layer 23. The second insulating layer 24 forms the lower surface 11a of the first package 11. In the second insulating layer 24, a plurality of openings from which the pads 23a and another end portion of the power supply wiring 23c are exposed are provided. Therefore, the pads 23a and the other end portion of the power supply wiring 23c are provided on the lower surface 11a of the first package 11.

The second wiring layer 25 is formed of a conductor such as copper and is provided on the upper surface 21b of the package layer 21. The second wiring layer 25 includes a connection terminal 25a and a connection wiring 25b. The connection terminal 25a and the connection wiring 25b are each an example of a connection conductor. The second wiring layer 25 may include another wiring.

The connection wiring 25b is connected to the connection terminal 25a. The connection wiring 25b extends along the upper surface 11b of the first package 11 between the connection terminal 25a and a position that is spaced from the memory controller 15 in the direction intersecting the negative direction of the Z-axis.

The third insulating layer 26 is, for example, a solder resist and is provided on the upper surface 21b of the package layer 21 and the second wiring layer 25. The third insulating layer 26 forms the upper surface 11b of the first package 11. In the third insulating layer 26, an opening from which the connection terminal 25a is exposed is provided. Therefore, the connection terminal 25a is provided on the upper surface 11b of the first package 11.

A plurality of vias 27 are provided in the package layer 21 and penetrates the package layer 21 in the Z-axis direction. The via 27 includes a hole which passes through the package layer 21 and a conductor that is provided in the hole or on an inner surface of the hole. The hole is provided in the package layer 21, which is formed of a synthetic resin, by laser beam machining or plating, for example.

The via 27 is spaced from the memory controller 15 in the direction intersecting the negative direction of the Z-axis and connects the connection wiring 23b of the first wiring layer 23 and the connection wiring 25b of the second wiring layer 25 to each other. Therefore, the connection wiring 23b of the first wiring layer 23 connects the second input/output terminal 17 and the via 27 to each other. In addition, the connection wiring 25b the second wiring layer 25 is connected to the via 27 so as to connect the via 27 and the connection terminal 25a to each other. Alternatively, the via 27 may connect the connection wiring 23b of the first wiring layer 23 and the connection terminal 25a to each other without providing the connection wiring 25b.

As illustrated in FIG. 3, the bumps 28 are, for example, semispherical solder bumps. The bump 28 may be formed in another shape. When being connected to the pads 23a, the bumps 28 are electrically connected to the first input/output terminals 16 through the pads 23a.

The pad 23a and the bump 28 are positioned at positions where the pad 23a and the bump 28 are directly below the first input/output terminal 16 to which the pad 23a and the bump 28 are electrically connected, in the negative direction of the Z-axis. Therefore, the pad 23a and the bump 28 are provided at positions where the pad 23a and the bump 28 are directly below the memory controller 15 in the negative direction of the Z-axis. The bump 28 protrudes from the pad 23a provided on the lower surface 11a of the first package 11 in the negative direction of the Z-axis.

As illustrated in FIG. 2, the power supply bump 29 is, for example, a semispherical solder bump. The power supply bump 29 may be formed in another shape. The power supply bump 29 is connected to an end portion of the power supply wiring 23c at a position that is spaced from the memory controller 15 in the direction intersecting the negative direction of the Z-axis. Therefore, the power supply wiring 23c connects the power supply terminal 18 and the power supply bump 29 to each other. The power supply bump 29 protrudes from the end portion of the power supply wiring 23c provided on the lower surface 11a of the first package 11 in the negative direction of the Z-axis.

The semiconductor storage device 7 is mounted on the motherboard 5 by flip chip mounting. The bump 28 and the power supply bump 29 are connected to the pads provided on the motherboard 5. When the semiconductor storage device 7 is mounted on the motherboard 5, the bump 28 is connected to the processor 6 through the wiring 9 of FIG. 11. Further, the power supply bump 29 is connected to the power supply circuit of the electronic apparatus 1.

The first package 11 may include a plurality of other bumps. The bumps include, for example, a bump that is connected to the ground pad or a bump that is separated from an electric circuit for fixing the semiconductor storage device 7.

The first package 11 may further include a conductive layer 31 indicated by a two-dot chain line in FIG. 2. The conductive layer 31 is, for example, a metal plate. The conductive layer 31 is provided in the package layer 21 and is positioned between the upper surface 21b of the package layer 21 and the upper surface 15b of the memory controller 15.

The conductive layer 31 overlaps the memory controller 15 in the negative direction of the Z-axis. As a result, the conductive layer 31 blocks an electromagnetic noise generated from the memory controller 15 and an external source. Further, the conductive layer 31 is used for heat dissipation of the memory controller 15.

The memory 12 is, for example, a NAND flash memory and stores information. The memory 12 may be another memory such as an NOR flash memory. The memory chips 12 are stacked on the upper surface 11b of the first package 11.

On a lower surface of each of the memory chips 12, an adhesive layer 12a is provided. The adhesive layer 12a is a die attach film (DAF) and is formed of, for example, a material including an acrylic polymer and an epoxy resin. The die attach film will also be referred to as a die bonding film. The adhesive layer 12a may contain an adhesive material. The memory 12 may be bonded to another memory 12 or the upper surface 11b of the first package 11 through the adhesive layer 12a.

The wires 13 are, for example, bonding wires. The wires 13 connect one memory 12 and another memory 12 to each other or connect the memory 12 and the connection terminal 25a provided on the upper surface 11b of the first package 11 to each other. As a result, the wires 13 electrically connect the memory chips 12 and the connection terminal 25a to each other.

The second input/output terminal 17 of the memory controller 15 is electrically connected to the memory chips 12 through the connection wiring 23b, the via 27, the connection wiring 25b, the connection terminal 25a, and the wires 13. As a result, the memory controller 15 transmits and receives a signal to and from the memory chips 12 and can control the memory chips 12.

The sealing resin 14 is, for example, a mold resin and is formed of a synthetic resin including an epoxy resin in which an inorganic material such as silicon dioxide is mixed. The sealing resin 14 may be formed of a material including another synthetic resin. Both the material of the sealing resin 14 and the material of the package layer 21 include an epoxy resin. Therefore, a thermal expansion coefficient of the sealing resin 14 and a thermal expansion coefficient of the package layer 21 are similar to each other.

The sealing resin 14 seals and covers the upper surface 11b of the first package 11, the memory chips 12, and the wires 13. The upper surface 11b of the first package 11, the memory chips 12, and the wires 13 are embedded in the sealing resin 14. In other words, the upper surface 11b of the first package 11, the memory chips 12, and the wires 13 are accommodated in the sealing resin 14 and are present in the sealing resin 14.

A diameter D1 of the bump 28 illustrated in FIG. 3, where the diameter D1 is the width of the bump 28 in a direction perpendicular to the negative direction of the Z-axis, is less than or equal to a diameter D2 of the first input/output terminal 16 to which the bump 28 is electrically connected. Therefore, a cross-sectional area of the bump 28 is less than or equal to a cross-sectional area of the first input/output terminal 16 to which the bump 28 is electrically connected.

Figure 4:
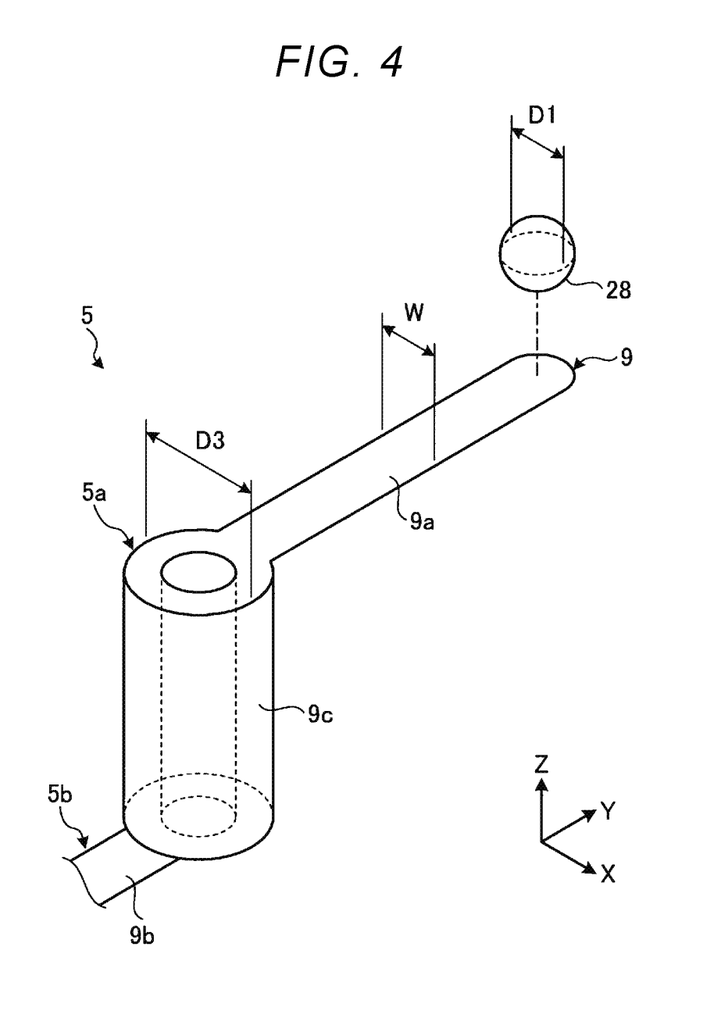
FIG. 4 is a perspective view schematically illustrating a wiring and a bump in the first embodiment.

FIG. 4 is a perspective view schematically illustrating the wiring 9 and the bump 28 in the first embodiment. The motherboard 5 illustrated in FIG. 4 is a multilayer plate and includes a plurality of layers 5a and 5b. The layers 5a and 5b may be layers that are provided on a surface of the motherboard 5, or may be layers that are provided in the motherboard 5.

The wiring 9 includes a first portion 9a, a second portion 9b, and a via 9c. The via 9c is an example of an interlayer connection conductor. The first portion 9a is a wiring pattern that is provided in the layer 5a. The second portion 9b is a wiring pattern that is provided in the layer 5b. The via 9c penetrates the motherboard 5 between the layer 5a and the layer 5b and connects the first portion 9a and the second portion 9b to each other. In some embodiments, the wiring 9 may be provided in one layer such that the via 9c is not provided.

The diameter D1 of the bump 28 is less than or equal to a diameter D3 of the via 9c. The diameter D3 is the width of the via 9c. Further, the diameter D1 of the bump 28 is less than or equal to a width W of the first portion 9a of the wiring 9. The width of the wiring 9 is substantially constant except for the via 9c. Therefore, the diameter D1 of the bump 28 is also less than or equal to a width of the second portion 9b of the wiring 9.

As indicated by a two-dot chain line in FIG. 2, the underfill 8 is filled between the semiconductor storage device 7 that is mounted by flip chip mounting and the motherboard 5. The underfill 8 prevents damages to a connection portion between the bump 28 and the power supply bump 29 and the pads of the motherboard 5.

In an electrical path between the processor 6 and the memory controller 15, a large parasitic capacitance may be generated in a portion (hereinafter, referred to as "extension portion") having a greater cross-sectional area than other portions. In the extension portion, the impedance decreases. The amount of decrease in the impedance becomes larger as the cross-sectional area of the extension portion increases. The decrease in the impedance may cause a mismatch of impedance in the electrical path such that the quality of a signal that is transmitted and received in an UFS or a PCIe at a high speed deteriorates.

In the embodiment, the cross-sectional area of the bump 28 is less than or equal to the cross-sectional area of the first input/output terminal 16. In addition, the diameter D1 of the bump 28 is less than or equal to each of the diameter D3 of the via 9c and the width of the wiring 9. Therefore, the amount of decrease in the impedance in the bump 28 is made smaller, and the deterioration in the quality of a signal transmitted and received between the processor 6 and the memory controller 15 is avoided.

In the electronic apparatus 1 according to the first embodiment described above, the bumps 28 protrude from the lower surface 11a of the first package 11 at positions where the bumps 28 are directly below the memory controller 15 in the negative direction of the Z-axis, and are electrically connected to the first input/output terminals 16. Therefore, an electrical path between the bump 28 and the first input/output terminal 16 is shorter than that when the bump 28 is spaced from the memory controller 15 in the direction intersecting the negative direction of the Z-axis. In addition, the bumps 28 are accommodated at the positions where the bumps 28 are directly below the memory controller 15 in the negative direction of the Z-axis such that the size of the bumps 28 is limited. Therefore, the size of the bump 28 is set to be less than that when at least one bump 28 is spaced from the memory controller 15 in the direction intersecting the negative direction of the Z-axis. As a result, in an electrical path between the first input/output terminal 16 and the bump 28, a decrease in the impedance caused by an increase in parasitic capacitance is avoided, and deterioration in the signal quality of the semiconductor storage device 7 caused by a mismatch of impedance is avoided.

The memory controller 15 is provided in the first package 11 and is positioned between the lower surface 11a and the upper surface 11b of the first package 11. As a result, the semiconductor storage device 7 can be made thinner than that when the memory controller 15 is mounted on a substrate.

The bump 28 is provided at a position where the bump 28 is directly below the first input/output terminal 16 to which the bump 28 is electrically connected in the negative direction of the Z-axis. As a result, an electrical path between the bump 28 and the first input/output terminal 16 is reduced, and the design of the electrical path is simple.

The cross-sectional area of the bump 28 perpendicular to the negative direction of the Z-axis is less than or equal to the cross-sectional area of the first input/output terminal 16. As a result, in an electrical path between the first input/output terminal 16 and the bump 28, a decrease in the impedance caused by an increase in parasitic capacitance in the bump 28 is avoided. Accordingly, deterioration in the signal quality of the semiconductor storage device 7 caused by a mismatch of impedance is avoided.

The diameter D1 of the bump 28 in the direction perpendicular to the negative direction of the Z-axis is less than or equal to the width W of the wiring 9. As a result, in an electrical path between the first input/output terminal 16 and the processor 6, a decrease in the impedance caused by an increase in parasitic capacitance in the bump 28 is avoided. Accordingly, deterioration in the signal quality of the semiconductor storage device 7 caused by a mismatch of impedance is avoided.

The diameter D1 of the bump 28 in the direction perpendicular to the negative direction of the Z-axis is less than or equal to the diameter D3 of the via 9c. As a result, in an electrical path between the first input/output terminal 16 and the processor 6, a decrease in the impedance caused by an increase in parasitic capacitance in the bump 28 is avoided. Accordingly, deterioration in the signal quality of the semiconductor storage device 7 caused by a mismatch of impedance is avoided.

The upper surface 11b of the first package 11 is greater than the upper surface 15b of the memory controller 15. The memory chips 12 are stacked on the upper surface 11b of the first package 11. As a result, the memory chips 12 can be stably stacked.

In the first embodiment, the bump 28 is provided at a position where bump 28 is directly below the first input/output terminal 16 in the negative direction of the Z-axis. However, in other embodiments, the bump 28 may be spaced from the first input/output terminal 16 in the direction intersecting the negative direction of the Z-axis so long as bump 28 is positioned at a position where bump 28 is directly below the memory controller 15 in the negative direction of the Z-axis.

Second Embodiment

Hereinafter, a second embodiment will be described with reference to FIG. 5. In the description of the following embodiments, a component having the same function as the component described above is represented by the same reference numeral as the above-described component, and the description will not be repeated. In addition, it is not necessary that all the functions and properties of the components represented by the same reference numeral be common, and the components represented by the same reference numeral may have different functions and properties according to each of the embodiments.

Figure 5:
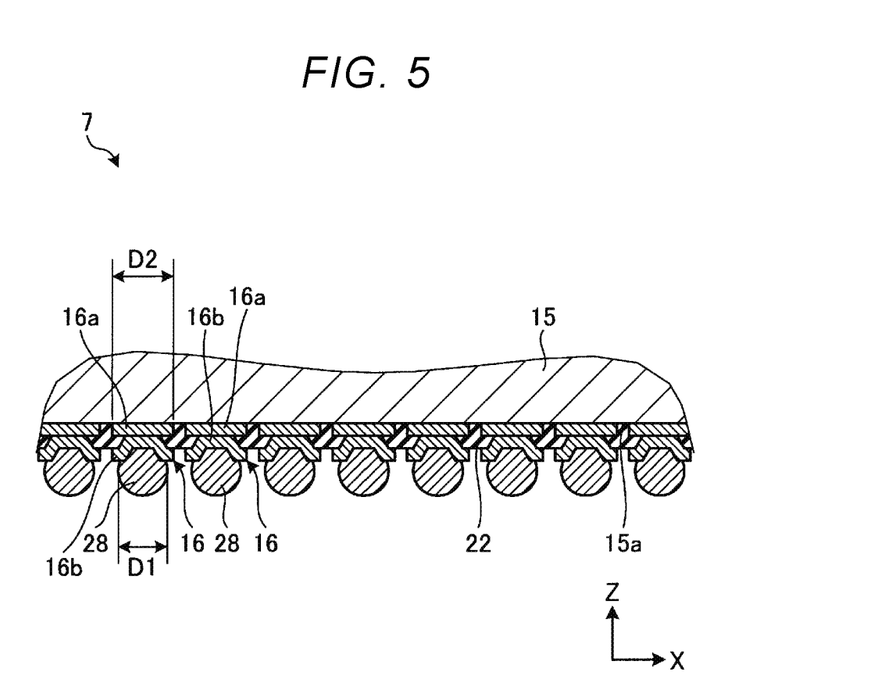
FIG. 5 is a cross-sectional view schematically illustrating a part of a semiconductor storage device according to a second embodiment.

FIG. 5 is a cross-sectional view schematically illustrating a part of the semiconductor storage device 7 according to the second embodiment. As illustrated in FIG. 5, in the second embodiment, the first input/output terminal 16 includes a pad 16a and a barrier metal 16b.

The pad 16a is formed of a conductor such as copper, a copper alloy, aluminum, or an aluminum alloy and is a terminal that is provided on the lower surface 15a of the memory controller 15. The pad 16a is exposed from an opening provided in the first insulating layer 22.

The barrier metal 16b is formed of a conductor such as titanium, nickel, tungsten, cobalt, palladium, or gold. The barrier metal 16b covers the exposed pad 16a and is connected to the pad 16a.

The bump 28 is, for example, a solder bump or a copper pillar bump including copper and a solder, and is connected to the barrier metal 16b. That is, the bump 28 is directly connected to the first input/output terminal 16. Therefore, the first input/output terminal 16 of the memory controller 15 is used as an input/output terminal of the semiconductor storage device 7 as it is. Alternatively, the barrier metal 16b may not be provided such that the bump 28 is directly connected to the pad 16a.

In the electronic apparatus 1 according to the second embodiment, the bumps 28 are directly connected to the first input/output terminals 16. Therefore, the size of the bump 28 is similar to the size of the first input/output terminal 16. Accordingly, in an electrical path between the first input/output terminal 16 and the bump 28, a decrease in the impedance caused by an increase in parasitic capacitance is avoided, and deterioration in the signal quality of the semiconductor storage device 7 caused by a mismatch of impedance is avoided.

Third Embodiment

Figure 6:
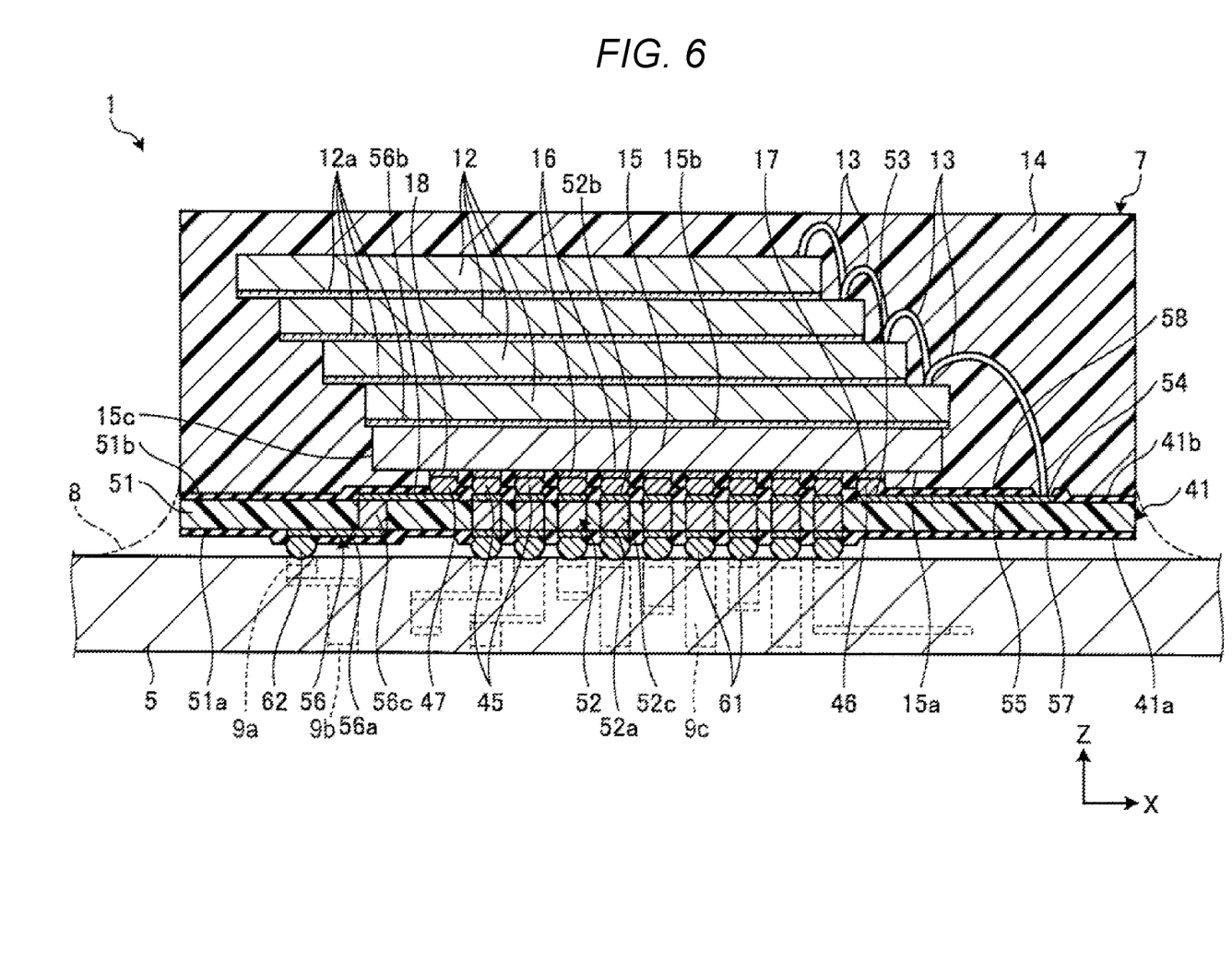
FIG. 6 is a cross-sectional view schematically illustrating a semiconductor storage device according to a third embodiment.

Hereinafter, a third embodiment will be described with reference to FIGS. 6 and 7. FIG. 6 is a cross-sectional view schematically illustrating the semiconductor storage device 7 according to the third embodiment. As illustrated in FIG. 6, the semiconductor storage device 7 according to the third embodiment includes the memory chips 12, the wires 13, the sealing resin 14, the memory controller 15, and a substrate 41.

The memory controller 15 according to the third embodiment further includes a plurality of controller bumps 45, a connection bump 46, and a power supply bump 47. The controller bumps 45, the connection bump 46, and the power supply bump 47 are, for example, semispherical solder bumps and protrude from the lower surface 15a of the memory controller 15 in the negative direction of the Z-axis.

The controller bumps 45 are connected to the first input/output terminals 16. The connection bump 46 is connected to the second input/output terminal 17. The power supply bump 47 is connected to the power supply terminal 18.

The substrate 41 is, for example, a printed wiring board. The substrate 41 includes a lower surface 41a and an upper surface 41b. The lower surface 41a is an example of a terminal surface. The upper surface 41b is an example of a terminal surface.

The lower surface 41a is a substantially flat surface that faces the negative direction of the Z-axis. The upper surface 41b is a substantially flat surface that is positioned opposite to the lower surface 41a and faces the positive direction of the Z-axis. The upper surface 41b faces the lower surface 15a of the memory controller 15.

The substrate 41 further includes a base 51, a plurality of connection conductors 52, a first connection terminal 53, a second connection terminal 54, a connection wiring 55, a power supply wiring 56, a first insulating layer 57, a second insulating layer 58, a plurality of outer bumps 61, and a power supply bump 62.

The base 51 is formed of an insulating material. The base 51 includes a lower surface 51a and an upper surface 51b. The lower surface 51a is a substantially flat surface that faces the negative direction of the Z-axis. The upper surface 51b is a substantially flat surface that faces the positive direction of the Z-axis.

Figure 7:
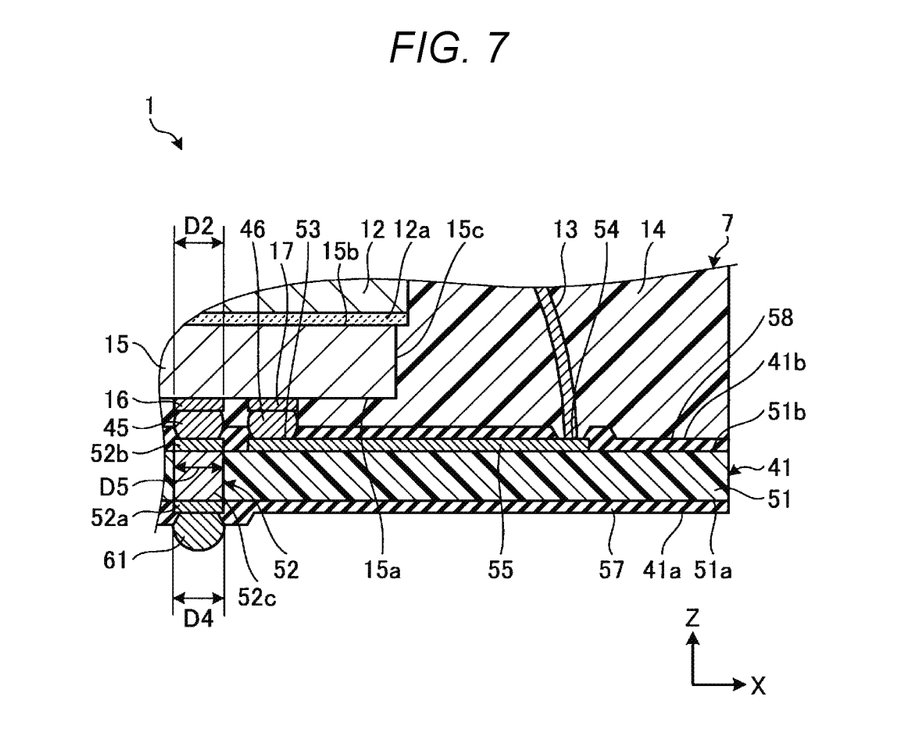
FIG. 7 is a cross-sectional view schematically illustrating a part of the semiconductor storage device according to the third embodiment.

FIG. 7 is a cross-sectional view schematically illustrating a part of the semiconductor storage device 7 according to the third embodiment. The connection conductor 52 is formed of a conductor such as copper. Each of the connection conductors 52 includes a first pad 52a, a second pad 52b, and a via 52c.

The first pad 52a is provided on the lower surface 51a of the base 51. The second pad 52b is provided on the upper surface 51b of the base 51 and faces the first input/output terminal 16 and the controller bump 45. Each of the first pad 52a and the second pad 52b is formed in a circular shape but may be formed in another shape such as a quadrangular shape. The via 52c is provided in the base 51 and penetrates the base 51 in the Z-axis direction. The via 52c connects the first pad 52a and the second pad 52b.

The first connection terminal 53, the second connection terminal 54, and the connection wiring 55 are formed of a conductor such as copper and are provided on the upper surface 51b of the base 51. The first connection terminal 53 faces the second input/output terminal 17. The second connection terminal 54 is provided at a position that is spaced from the memory controller 15 in the direction intersecting the negative direction of the Z-axis. The connection wiring 55 connects the first connection terminal 53 and the second connection terminal 54. A barrier metal may be formed on a surface of the first connection terminal 53 in order to improve solder connectivity, and a nickel/gold plating may be formed on a surface of the second connection terminal 54 in order to improve wire bondability.

The power supply wiring 56 illustrated in FIG. 6 is formed of a conductor such as copper and includes a first power supply conductor 56a, a second power supply conductor 56b, and a power supply via 56c. In the embodiment, the first power supply conductor 56a and the second power supply conductor 56b are a wiring pattern and a pad but may simply be pads.

The first power supply conductor 56a is provided on the lower surface 51a of the base 51. The second power supply conductor 56b is provided on the upper surface 51b of the base 51. The power supply via 56c is provided in the base 51 and penetrates the base 51 in the Z-axis direction. The power supply via 56c connects the first power supply conductor 56a and the second power supply conductor 56b.

The first power supply conductor 56a extends along the lower surface 41a of the substrate 41 between the power supply via 56c and a position that is spaced from the memory controller 15 in the direction intersecting the negative direction of the Z-axis. The second power supply conductor 56b extends along the upper surface 41b of the substrate 41 between the power supply via 56c and a position where the second power supply conductor 56b is directly below the memory controller 15 in the negative direction of the Z-axis.

The first insulating layer 57 is, for example, a solder resist and is provided on the lower surface 51a of the base 51. The first insulating layer 57 forms the lower surface 41a of the substrate 41. In the first insulating layer 57, a plurality of openings from which the first pads 52a and an end portion of the first power supply conductor 56a are exposed are provided. Therefore, the first pads 52a and the end portion of the first power supply conductor 56a are provided on the lower surface 41a of the substrate 41. The end portion of the first power supply conductor 56a may be directly below pads as in the case of the other connection conductors.

The second insulating layer 58 is, for example, a solder resist and is provided on the upper surface 51b of the base 51. The second insulating layer 58 forms the upper surface 41b of the substrate 41. In the second insulating layer 58, a plurality of openings from which the second pads 52b, the first connection terminal 53, the second connection terminal 54, and an end portion of the second power supply conductor 56b are exposed are provided. Therefore, the second pads 52b, the first connection terminal 53, the second connection terminal 54, and the end portion of the second power supply conductor 56b are provided on the upper surface 41b of the substrate 41.

The memory controller 15 is mounted on the substrate 41 by flip chip mounting. The controller bumps 45 are connected to the second pads 52b of the connection conductor 52. The connection bump 46 is connected to the first connection terminal 53. Therefore, the first connection terminal 53 is electrically connected to the second input/output terminal 17 through the connection bump 46. Further, the power supply bump 47 is connected to the end portion of the second power supply conductor 56b. Therefore, the power supply wiring 56 is electrically connected to the power supply terminal 18.

As illustrated in FIG. 7, each of the connection conductors 52 is provided at a position where the connection conductor 52 is directly below the first input/output terminal 16 to which the connection conductor 52 is electrically connected in the negative direction of the Z-axis. Therefore, the connection conductors 52 are provided at positions where the connection conductors 52 are directly below the memory controller 15 in the negative direction of the Z-axis.

The outer bumps 61 are, for example, semispherical solder bumps and are connected to the first pads 52a of the connection conductors 52. Therefore, the connection conductors 52 connect the controller bumps 45 and the outer bumps 61 to each other. The outer bump 61 is electrically connected to the first input/output terminal 16 through the connection conductor 52 and the controller bump 45.

The outer bump 61 is positioned at a position where the outer bump 61 is directly below the first input/output terminal 16 to which the outer bump 61 is electrically connected in the negative direction of the Z-axis. Therefore, the outer bump 61 is positioned at a position where the outer bump 61 is directly below the memory controller 15 in the negative direction of the Z-axis. The outer bump 61 protrudes from the first pad 52a provided on the lower surface 41a of the substrate 41 in the negative direction of the Z-axis.

As illustrated in FIG. 6, the power supply bump 62 is, for example, a semispherical solder bump. The power supply bump 62 is connected to an end portion of the first power supply conductor 56a of the power supply wiring 56 at a position that is spaced from the memory controller 15 in the direction intersecting the negative direction of the Z-axis. Therefore, the power supply wiring 56 connects the power supply terminal 18 and the power supply bump 62 to each other. The power supply bump 62 protrudes from an end portion of the first power supply conductor 56a provided on the lower surface 41a of the substrate 41 in the negative direction of the Z-axis.

The semiconductor storage device 7 is mounted on the motherboard 5 by flip chip mounting. The outer bump 61 is connected to a pad provided in the motherboard 5. When the semiconductor storage device 7 is mounted on the motherboard 5, the outer bump 61 is connected to the processor 6 through the wiring 9 of FIG. 1. Further, the power supply bump 62 is connected to the power supply circuit of the electronic apparatus 1.

The substrate 41 may include a plurality of other bumps. The bumps include, for example, a bump that is connected to the ground pad or a bump that is separated from an electric circuit for fixing the semiconductor storage device 7.

The memory chips 12 are stacked on the upper surface 15b of the memory controller 15. The memory 12 may be bonded to another memory 12 or the upper surface 15b of the memory controller 15 through the adhesive layer 12a. The memory controller 15 may be embedded in the adhesive layer 12a.

The wires 13 connect one memory 12 and another memory 12 to each other or connect the memory 12 and the second connection terminal 54 provided on the upper surface 41b of the substrate 41 to each other. As a result, the wires 13 electrically connect the memory chips 12 and the second connection terminal 54 to each other.

The second input/output terminal 17 of the memory controller 15 is electrically connected to the memory chips 12 through the connection bump 46, the first connection terminal 53, the connection wiring 55, the second connection terminal 54, and the wire 13. As a result, the memory controller 15 transmits and receives a signal to and from the memory chips 12 and can control the memory chips 12.

The sealing resin 14 seals and covers the upper surface 41b of the substrate 41, the memory controller 15, the memory chips 12, and the wires 13. The upper surface 41b of the substrate 41, the memory controller 15, the memory chips 12, and the wires 13 are embedded in the sealing resin 14.

Referring now to FIG. 7, a diameter D4 of the outer bump 61 is less than or equal to the diameter D2 of the first input/output terminal 16 to which the outer bump 61 is electrically connected. Therefore, a cross-sectional area of the outer bump 61 is less than or equal to a cross-sectional area of the first input/output terminal 16 to which the outer bump 61 is electrically connected. The diameter D4 is the width of the outer bump 61 in the direction perpendicular to the negative direction of the Z-axis.

The diameter D4 of the outer bump 61 is less than or equal to a diameter D5 of the connection conductor 52 to which the outer bump 61 is connected. Therefore, the cross-sectional area of the outer bump 61 is less than or equal to a cross-sectional area of the connection conductor 52 to which the outer bump 61 is connected.

In the embodiment, each of the first pad 52a, the second pad 52b, and the via 52c of the connection conductor 52 have the same diameter D5. However, the first pad 52a, the second pad 52b, and the via 52c may have different diameters. In such a case, the diameter D5 is the maximum diameter among the diameters of the first pad 52a, the second pad 52b, and the via 52c.

As described above, the size and pitch of the connection conductors 52 and the outer bumps 61 substantially match with those of the first input/output terminals 16. However, the outer bump 61 may be spaced in the direction intersecting the negative direction of the Z-axis more than the first input/output terminals 16 are spaced, as long they are provided at a position where the bumps are directly below the memory controller 15 in the negative direction of the Z-axis.

The diameter D4 of the outer bump 61 is less than or equal to the diameter D3 of the via 9c of FIG. 4. Further, the diameter D4 of the outer bump 61 is less than or equal to the width W of each of the first portion 9a and the second portion 9b of the wiring 9.

In the electronic apparatus 1 according to the third embodiment described above, the outer bumps 61 protrude from the lower surface 41a of the substrate 41 at positions where the outer bumps 61 are directly below the memory controller 15 in the negative direction of the Z-axis. The connection conductors 52 are provided at positions where he connection conductors 52 are directly below the memory controller 15 in the negative direction of the Z-axis, and connect the controller bumps 45 and the outer bumps 61 to each other. Therefore, an electrical path between the controller bump 45 and the outer bump 61 is shorter than that when the outer bump 61 and the connection conductor 52 are spaced from the memory controller 15 in the direction intersecting the negative direction of the Z-axis. In addition, the outer bumps 61 are accommodated at the positions where the outer bumps 61 are directly below the memory controller 15 in the negative direction of the Z-axis such that the size of the outer bumps 61 is limited. Therefore, the size of the outer bumps 61 is set to be less than that when at least one outer bump 61 is spaced from the memory controller 15 in the direction intersecting the negative direction of the Z-axis. As a result, in an electrical path between the first input/output terminal 16 and the outer bump 61, a decrease in the impedance caused by an increase in parasitic capacitance is avoided, and deterioration in the signal quality of the semiconductor storage device 7 caused by a mismatch of impedance is avoided.

The memory controller 15 is mounted on the substrate 41 by flip chip mounting through the controller bump 45, the connection bump 46, and the power supply bump 47. As a result, a bonding wire or a DAF is not necessary, and the semiconductor storage device 7 can be made thin.

The outer bump 61 is positioned at a position where the outer bump 61 is directly below the first input/output terminal 16 to which the outer bump 61 is electrically connected in the negative direction of the Z-axis. As a result, an electrical path between the outer bump 61 and the first input/output terminal 16 is reduced, and the design of the electrical path is simple.

The cross-sectional area of the outer bump 61 perpendicular to the negative direction of the Z-axis is less than or equal to the cross-sectional area of the first input/output terminal 16. As a result, in an electrical path between the first input/output terminal 16 and the outer bump 61, a decrease in the impedance caused by an increase in parasitic capacitance in the outer bump 61 is avoided. Accordingly, deterioration in the signal quality of the semiconductor storage device 7 caused by a mismatch of impedance is avoided.

The cross-sectional area of the outer bump 61 perpendicular to the negative direction of the Z-axis is less than or equal to the cross-sectional area of the connection conductor 52 perpendicular to the negative direction of the Z-axis. As a result, in an electrical path between the first input/output terminal 16 and the outer bump 61, a decrease in the impedance caused by an increase in parasitic capacitance in the outer bump 61 is avoided. Accordingly, deterioration in the signal quality of the semiconductor storage device 7 caused by a mismatch of impedance is avoided.

The diameter D4 of the outer bump 61 in the direction perpendicular to the negative direction of the Z-axis is less than or equal to the width W of the wiring 9. As a result, in an electrical path between the first input/output terminal 16 and the processor 6, a decrease in the impedance caused by an increase in parasitic capacitance in the outer bump 61 is avoided. Accordingly, deterioration in the signal quality of the semiconductor storage device 7 caused by a mismatch of impedance is avoided.

The diameter D4 of the outer bump 61 in the direction perpendicular to the negative direction of the Z-axis is less than or equal to the diameter D3 of the via 9c. As a result, in an electrical path between the first input/output terminal 16 and the processor 6, a decrease in the impedance caused by an increase in parasitic capacitance in the outer bump 61 is avoided. Accordingly, deterioration in the signal quality of the semiconductor storage device 7 caused by a mismatch of impedance is avoided.

According to at least one of the embodiments described above, the bumps protrude from the first surface at positions where the bumps are directly below the memory controller in the first direction, and are electrically connected to the first input/output terminals. Therefore, an electrical path between the bump and the first input/output terminal is shorter than that when the bump is spaced from the memory controller in a direction intersecting the first direction. For example, the bump is directly connected to the first input/output terminal. In addition, the bump is accommodated at the position where the bump is directly below the memory controller in the first direction such that the size of the bump is limited. Therefore, the size of the bump is set to be less than that when at least one bump is spaced from the memory controller in the direction intersecting the first direction. As a result, in an electrical path between the first input/output terminal and the bump, a decrease in the impedance caused by an increase in parasitic capacitance is avoided, and deterioration in the signal quality of the semiconductor storage device caused by a mismatch of impedance is avoided.

Besides, the explanation described in FIG. 1 and FIG. 4 of the first embodiment is also applicable to the second and the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a first package including a first surface that faces a first direction, a second surface that is opposite to the first surface, a first semiconductor chip that is provided between the first surface and the second surface, a plurality of first terminals provided on the first semiconductor chip and facing the first direction, a second terminal that is provided on the first semiconductor chip and faces the first direction, a power supply terminal, a first interlayer connection conductor that is spaced from the first semiconductor chip in a second direction intersecting the first direction, a first connection conductor that connects the second terminal and the first interlayer connection conductor to each other, a second connection conductor at least a part of which is provided on the second surface and that is connected to the first interlayer connection conductor, a plurality of first bumps that are electrically connected to the plurality of first terminals and protrude from the first surface at positions that are directly below the first semiconductor chip in the first direction, and a power supply bump that is electrically connected to the power supply terminal, wherein there is no bump between the first bumps and the power supply bump that is not directly below the first semiconductor chip in the first direction;
a second semiconductor chip provided on the second surface;
a wire that electrically connects the second semiconductor chip and the second connection conductor to each other; and
a second package including a coating resin that covers the second surface, the second semiconductor chip and the wire.

2. The electronic apparatus according to claim 1, wherein each of the first bumps is provided at a position where the first bump is directly below the first terminal to which the first bump is electrically connected, in the first direction.

3. The electronic apparatus according to claim 1, wherein the plurality of first bumps are directly connected to the plurality of first terminals.

4. The electronic apparatus according to claim 3, wherein each of the first terminals includes a pad and a barrier metal between the pad the corresponding first bump.

5. The electronic apparatus according to claim 1, wherein a largest area of a cross-section taken along a plane perpendicular to the first direction of each of the first bumps is less than or equal to a largest area of a cross-section taken along a plane perpendicular to the first direction of the first terminal, to which the first bump is electrically connected.

6. The electronic apparatus according to claim 1, wherein the first package includes
a mold resin covering the first semiconductor chip, and
an insulating layer formed on a surface of the first semiconductor chip, which faces the first direction.

7. The electronic apparatus according to claim 1, further comprising:
a third semiconductor chip that controls the first semiconductor chip; and
a substrate including a plurality of wirings connected to the plurality of first bumps and the third semiconductor chip,
wherein a largest width of the first bump in the second direction is less than or equal to a width of the wiring.

8. The electronic apparatus according to claim 1, further comprising:
a third semiconductor chip that controls the first semiconductor chip; and
a substrate including a plurality of layers, a plurality of wirings that are provided in the layers and connect the plurality of first bumps and the third semiconductor chip to each other, and a second interlayer connection conductor that connects a part of the wiring provided in one of the layers and a part of the wiring provided in another one of the layers to each other, wherein a maximum width of the first bump in the second direction is less than or equal to a maximum width of the second interlayer connection conductor in the second direction.

9. The electronic apparatus according to claim 1, wherein
the first semiconductor chip is a memory controller,
the second semiconductor chip is a memory chip, and further comprising:
a plurality of additional memory chips stacked on the second semiconductor chip.

10. The electronic apparatus according to claim 1, wherein
the plurality of first terminals are input/output terminals which transmit and receive a signal to and from a device that is outside of the first package and the second package,
the second terminal is an input/output terminal which transmits and receives a signal to and from the second semiconductor chip.

11. An electronic apparatus comprising:
a first package including a first surface that faces a first direction, a second surface that is opposite to the first surface, a first semiconductor chip that is provided between the first surface and the second surface, a plurality of first input/output terminals provided on the first semiconductor chip and facing the first direction, a second input/output terminal that is provided on the first semiconductor chip and faces the first direction, a power supply terminal, a first interlayer connection conductor that is spaced from the first semiconductor chip in a second direction intersecting the first direction, a first connection conductor that connects the second input/output terminal and the first interlayer connection conductor to each other, a second connection conductor at least a part of which is provided on the second surface and that is connected to the first interlayer connection conductor, a plurality of first bumps that are electrically connected to the plurality of first input/output terminals and protrude from the first surface at positions that are directly below the first semiconductor chip in the first direction, and a power supply bump that is electrically connected to the power supply terminal, wherein there is no bump between the first bumps and the power supply bump that is not directly below the first semiconductor chip in the first direction,
a mold resin encapsulating the first semiconductor chip, and an insulating layer formed on a surface of the first semiconductor chip facing the first direction;
a plurality of second semiconductor chips stacked on the second surface;
a wire that electrically connects the plurality of second semiconductor chips and the second connection conductor to each other;
a second package including a coating resin that covers the second surface, the second semiconductor chips and the wire;
a third semiconductor chip that controls the first semiconductor chip; and
a substrate including a plurality of wirings connected to the plurality of first bumps and the third semiconductor chip,
wherein a maximum width of the first bump in the second direction is less than or equal to a maximum width of the wirings.

12. The electronic apparatus according to claim 11, wherein
the substrate includes a plurality of layers, a plurality of wirings that are provided in the layers, and a second interlayer connection conductor that connects a part of the wiring provided in one of the layers and a part of the wiring provided in another one of the layers to each other,
the first semiconductor chip is a memory controller,
the second semiconductor chip is a memory chip,
the third semiconductor chip is a processor,
the memory controller and the processor communicate with each other through the first input/output terminals, and
the memory controller and the memory chip communicate with each other through the second input/output terminal.

13. The electronic apparatus according to claim 11, wherein each of the first bumps is provided at a position where the first bump is directly below the first input/output terminal to which the first bump is electrically connected, in the first direction.

14. The electronic apparatus according to claim 11, wherein the plurality of first bumps are directly connected to the plurality of first input/output terminals.

15. The electronic apparatus according to claim 14, wherein each of the first input/output terminals includes a pad and a barrier metal between the pad the corresponding first bump.

16. The electronic apparatus according to claim 11, wherein a largest area of a cross-section taken along a plane perpendicular to the first direction of each of the first bumps is less than or equal to a largest area of a cross-section taken along a plane perpendicular to the first direction of the first input/output terminal, to which the first bump is electrically connected.

17. The electronic apparatus according to claim 11, wherein the first package includes
a mold resin covering the first semiconductor chip, and
an insulating layer formed on a surface of the first semiconductor chip, which faces the first direction.

18. The electronic apparatus according to claim 11, wherein
the first semiconductor chip is a memory controller, and
the second semiconductor chip is a memory chip.

* * * * *